United States Patent
Lee et al.

(10) Patent No.: US 9,634,237 B2
(45) Date of Patent: Apr. 25, 2017

(54) ULTRATHIN PERPENDICULAR PINNED LAYER STRUCTURE FOR MAGNETIC TUNNELING JUNCTION DEVICES

(71) Applicant: QUALCOMM Incorporated, San Diego, CA (US)

(72) Inventors: Kangho Lee, San Diego, CA (US); Jimmy Kan, San Diego, CA (US); Xiaochun Zhu, San Diego, CA (US); Matthias Georg Gottwald, Leuven (BE); Chando Park, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/581,361

(22) Filed: Dec. 23, 2014

(65) Prior Publication Data

US 2016/0181508 A1 Jun. 23, 2016

(51) Int. Cl.
| | |
|---|---|
| *H01L 29/82* | (2006.01) |
| *H01L 43/02* | (2006.01) |
| *H01L 43/08* | (2006.01) |
| *H01L 43/10* | (2006.01) |
| *H01L 43/12* | (2006.01) |
| *H01F 10/32* | (2006.01) |

(52) U.S. Cl.
CPC ......... *H01L 43/02* (2013.01); *H01F 10/3272* (2013.01); *H01F 10/3286* (2013.01); *H01L 43/08* (2013.01); *H01L 43/10* (2013.01); *H01L 43/12* (2013.01)

(58) Field of Classification Search
CPC ..... H01L 43/08; H01L 29/82; H01L 23/5226; H01L 23/528; H01L 27/222; H01L 43/065; G11C 11/16
USPC ......... 257/20, 414, 421–427, E29.32; 438/3; 365/157–158, 171–173; 360/324–326, 360/313
See application file for complete search history.

(56) References Cited

U.S. PATENT DOCUMENTS

| | | | |
|---|---|---|---|
| 7,193,284 B2 * | 3/2007 | Yagami | B82Y 25/00 257/295 |
| 8,492,859 B2 | 7/2013 | Hu | |
| 8,545,999 B1 | 10/2013 | Leng et al. | |
| 8,796,797 B2 | 8/2014 | Doyle et al. | |
| 9,184,376 B2 * | 11/2015 | Park | H01L 43/10 |
| 2005/0057992 A1 * | 3/2005 | Yagami | B82Y 25/00 365/222 |

(Continued)

OTHER PUBLICATIONS

International Search Report and Written Opinion—PCT/US2015/058839—ISA/EPO—May 27, 2016.

(Continued)

*Primary Examiner* — Jami M Valentine
(74) *Attorney, Agent, or Firm* — Seyfarth Shaw LLP

(57) ABSTRACT

A material stack of a synthetic anti-ferromagnetic (SAF) reference layer of a perpendicular magnetic tunnel junction (MTJ) may include an SAF coupling layer. The material stack may also include and an amorphous spacer layer on the SAF coupling layer. The amorphous spacer layer may include an alloy or multilayer of tantalum and cobalt or tantalum and iron or cobalt and iron and tantalum. The amorphous spacer layer may also include a treated surface of the SAF coupling layer.

5 Claims, 9 Drawing Sheets

(56) References Cited

U.S. PATENT DOCUMENTS

| | | | | |
|---|---|---|---|---|
| 2005/0157433 A1* | 7/2005 | Kamiguchi | ............ | B82Y 10/00 360/324.1 |
| 2006/0180839 A1* | 8/2006 | Fukumoto | ............ | B82Y 25/00 257/295 |
| 2008/0144234 A1* | 6/2008 | Lin | ............ | B82Y 25/00 360/324.11 |
| 2008/0179699 A1 | 7/2008 | Horng et al. | | |
| 2008/0273375 A1 | 11/2008 | Dahmani et al. | | |
| 2009/0079018 A1* | 3/2009 | Nagase | ............ | B82Y 25/00 257/421 |
| 2009/0080239 A1* | 3/2009 | Nagase | ............ | H01L 27/228 365/158 |
| 2009/0218645 A1* | 9/2009 | Ranjan | ............ | G11C 11/16 257/421 |
| 2012/0063218 A1 | 3/2012 | Huai et al. | | |
| 2012/0068281 A1* | 3/2012 | Saida | ............ | G11C 11/161 257/421 |
| 2012/0205757 A1 | 8/2012 | Zhang et al. | | |
| 2013/0005051 A1 | 1/2013 | Hu et al. | | |
| 2013/0207209 A1 | 8/2013 | Wang et al. | | |
| 2014/0027869 A1* | 1/2014 | Lee | ............ | H01L 43/12 257/421 |
| 2014/0175575 A1* | 6/2014 | Doyle | ............ | H01L 43/08 257/421 |
| 2015/0162525 A1* | 6/2015 | Park | ............ | H01L 43/08 257/421 |
| 2015/0340600 A1* | 11/2015 | Kim | ............ | H01L 43/10 257/421 |
| 2016/0093798 A1* | 3/2016 | Kim | ............ | H01L 43/08 257/421 |

OTHER PUBLICATIONS

Partial International Search Report—PCT/US2015/058839—ISA/EPO—Feb. 4, 2016.

* cited by examiner

ULTRATHIN PERPENDICULAR PINNED LAYER STRUCTURE FOR MAGNETIC TUNNELING JUNCTION DEVICES

BACKGROUND

Field

Certain aspects of the present disclosure generally relate to magnetic tunneling junction (MTJ) devices, and more particularly to pinned layer structures of MTJ devices.

Background

Unlike conventional random access memory (RAM) chip technologies, in magnetic RAM (MRAM) data is stored by magnetization of storage elements. The basic structure of the storage elements consists of metallic ferromagnetic layers separated by a thin tunneling barrier. Typically, the ferromagnetic layers underneath the barrier (e.g., the pinned layer) have a magnetization that is fixed in a particular direction. The ferromagnetic magnetic layers above the tunneling barrier (e.g., the free layer) have a magnetization direction that may be altered to represent either a "1" or a "0." For example, a "1" may be represented when the free layer magnetization is anti-parallel to the fixed layer magnetization. In addition, a "0" may be represented when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional MRAM, a write current, which exceeds a critical switching current, is applied through an MTJ. Application of a write current that exceeds the critical switching current changes the magnetization direction of the free layer. When the write current flows in a first direction, the MTJ may be placed into or remain in a first state in which its free layer magnetization direction and fixed layer magnetization direction are aligned in a parallel orientation. When the write current flows in a second direction, opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

Spin transfer torque magnetic random access memory (STT-MRAM) is an emerging type of nonvolatile memory that operates at a higher speed than off chip dynamic random access memory (DRAM). In addition, STT-MRAM has a smaller chip size than embedded static random access memory (eSRAM), unlimited read/write endurance, and a low array leakage current.

In one category of STT-MRAM cells, a direction of polarization of the free layer and the reference layer of a magnetic tunnel junction (MTJ) is parallel to the plane of the respective layer. Such memory cells are referred to as having in-plane magnetic anisotropy or longitudinal magnetic anisotropy (LMA). The direction of magnetic polarization of MRAM cells with in-plane magnetic anisotropy is provided by constructing memory cells with an elongated shape, such as an ellipse. The elongated shape provides pole locations at each end for the magnetic moment to tend toward or away from.

In another category of STT-MRAM cells, the direction of polarization of the free layer and reference layer of an MTJ is perpendicular to the plane of the respective layer. Such memory cells are referred to as having perpendicular magnetic anisotropy (PMA). The direction of magnetic polarization in a layer of a PMA type of STT-MRAM cell is inherently directional, i.e., perpendicular to the layer. Therefore the PMA type STT-MRAM cells can have a symmetric shape, such as a circular shape, that can be more easily fabricated than elongated in-plane MRAM cells. Circular shaped PMA type STT-MRAM cells have a smaller area than elongated in-plane STT-MRAM cells and therefore may facilitate the development of more deeply scaled memory devices. Also, because the switching current of an STT-MRAM cell is proportional to its area, PMA type STT-MRAM cells may consume less power than in-plane type STT-MRAM cells. An MTJ in which the direction of polarization of the free layer and reference layer is perpendicular to the plane of the respective layer may be referred to as a perpendicular MTJ, or a pMTJ.

SUMMARY

A material stack of a synthetic anti-ferromagnetic (SAF) reference layer of a perpendicular magnetic tunnel junction (MTJ) may include an SAF coupling layer. The material stack may also include and an amorphous spacer layer on the SAF coupling layer. The amorphous spacer layer includes an alloy or multilayer of tantalum and cobalt or tantalum and iron or cobalt and iron and tantalum.

A material stack of a synthetic anti-ferromagnetic (SAF) reference layer of a perpendicular magnetic tunnel junction (MTJ) may include an SAF coupling layer. The material stack may also include an amorphous spacer layer on the SAF coupling layer. The amorphous spacer layer may include a treated surface of the SAF coupling layer.

A perpendicular magnetic tunnel junction (MTJ) includes a perpendicular free layer, a perpendicular synthetic anti-ferromagnetic (SAF) reference layer; and a tunnel barrier layer between the SAF reference layer and the perpendicular free layer. The SAF reference layer may include a first anti-parallel material stack, a second anti-parallel material stack between the first anti-parallel material stack and the tunnel barrier layer, and an SAF coupling layer between the first anti-parallel material stack and the second anti-parallel material stack. The second anti-parallel material stack may include a means for blocking diffusion of boron from the second material stack to the first material stack to improve thermal stability of the SAF reference layer during an annealing process.

A method of reducing synthetic anti-ferromagnetic (SAF) reference layer thickness in a perpendicular magnetic tunnel junction (MTJ) may include forming a first anti-parallel perpendicular magnetic anisotropy (PMA) material stack including repetitions of PMA multilayers of cobalt and platinum, cobalt and palladium or cobalt and nickel. The method may also include depositing an SAF coupling layer on the first anti-parallel material stack and forming a second anti-parallel PMA material stack on the SAF coupling layer.

The second anti-parallel PMA material stack may have no repetitions of PMA multilayers. The method also includes forming an amorphous spacer layer on the SAF coupling layer to maintain or increase TMR provided by the SAF reference layer during high temperature annealing.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

In a conventional perpendicular magnetic tunnel junction (pMTJ) structure, a buffer layer provides a structural buffer against a tunneling magneto resistance (TMR) enhancement layer (e.g., a cobalt-iron-boron (CoFeB) layer) to avoid disturbing the crystal orientation in the TMR enhancement layer. The buffer layer also acts as a diffusion barrier and magnetic coupling layer to enhance tunneling magnetic resistance. The buffer layer may be composed of tantalum.

In the conventional pMTJ structure, numerous repeats of cobalt (Co) and platinum (Pt) layers are provided to achieve a predetermined thermal stability and tunneling magneto resistance. The numerous repeats of Co and Pt layers, however, add significant thickness to a synthetic antiferromagnetic (SAF) reference layer. The overall height of the SAF reference layer may be between 15 and 30 nanometers to achieve the desired thermal stability and tunneling magneto resistance. Reducing the thickness of the SAF reference by reducing the number of repeats of Co and Pt layers may fail to provide the desired thermal stability and tunneling magneto resistance.

Aspects of the present disclosure include a pMTJ structure with reduced repeats of Co and Pt layers, while retaining the desired thermal stability and the tunneling magneto resistance. Reducing the total thickness of a multi-layer material stack in a pMTJ structure generally has the effect of reducing a surface roughness of the material stack. The reduced surface roughness improves the thermal stability and perpendicular magnetic anisotropy (PMA) of the pMTJ structure. Thus, a pMTJ structure constructed with a thinner material stack generally exhibits better thermal stability, better PMA and better TMR than a pMTJ structure constructed with a thicker martial stack. This substantially decreases the overall thickness to create an ultrathin perpendicular SAF reference layer structure. The ultrathin perpendicular SAF reference layer also allows faster etching times, with reduced surface roughness and simpler fabrication.

Figure 1:
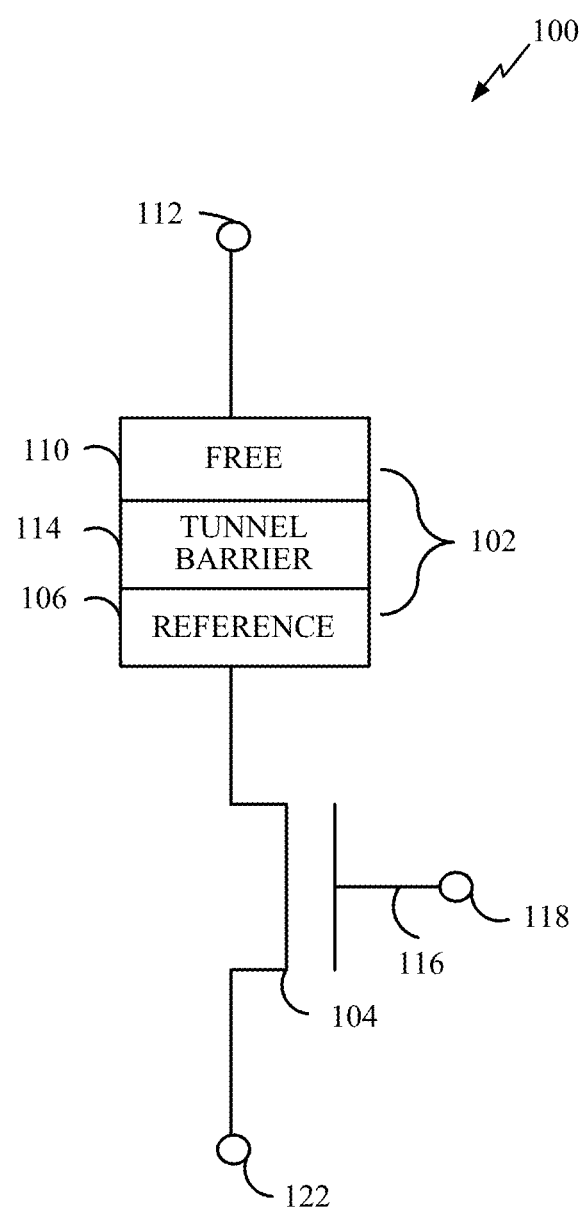
FIG. 1 is a diagram of a magnetic tunnel junction (MTJ) device connected to an access transistor.

FIG. 1 illustrates a memory cell 100 of a memory device including a perpendicular magnetic tunnel junction (pMTJ) 102 coupled to an access transistor 104. The memory device may be a spin torque transfer magnetic random access memory (STT-MRAM) device that is built from an array of individually addressable pMTJs. A pMTJ stack may include a free layer, a reference layer and a tunnel barrier layer there-between as well as one or more ferromagnetic layers. Representatively, a free layer 110 of the pMTJ 102 is coupled to a bit line 112. The access transistor 104 is coupled between a reference layer 106 of the pMTJ 102 and a fixed potential node 122. A tunnel barrier layer 114 is coupled between the reference layer 106 and the free layer 110. The access transistor 104 includes a gate 116 coupled to a word line 118.

Conventionally the reference layer 106 of a pMTJ 102 may be formed form synthetic anti-ferromagnetic materials. Anti-ferromagnetic materials are materials in which the magnetic moments of atoms or molecules, usually related to the spins of electrons, align in a regular pattern with neighboring spins (on different sub-lattices) pointing in opposite directions. Synthetic antiferromagnetic (SAF) materials are artificial antiferromagnetic material stacks including two or more thin ferromagnetic layers separated by a nonmagnetic layer. Due to dipole coupling of the ferromagnetic layers which results in antiparallel alignment of the magnetization of the ferromagnetic material stacks.

The reference layer of a pMTJ is commonly constructed as a synthetic antiferromagnetic (SAF) layer. For example, the reference layer 106 may comprise multiple material layers including a cobalt-iron-boron (CoFeB) layer, a ruthenium (Ru) layer and a cobalt-iron (CoFe) layer. The free layer 110 may also include multiple material layers including a cobalt-iron-boron (CoFeB) layer, a ruthenium (Ru) layer and a cobalt-iron (CoFe) layer. Further, the tunnel barrier layer 114 may be magnesium oxide (MgO).

Figure 2:
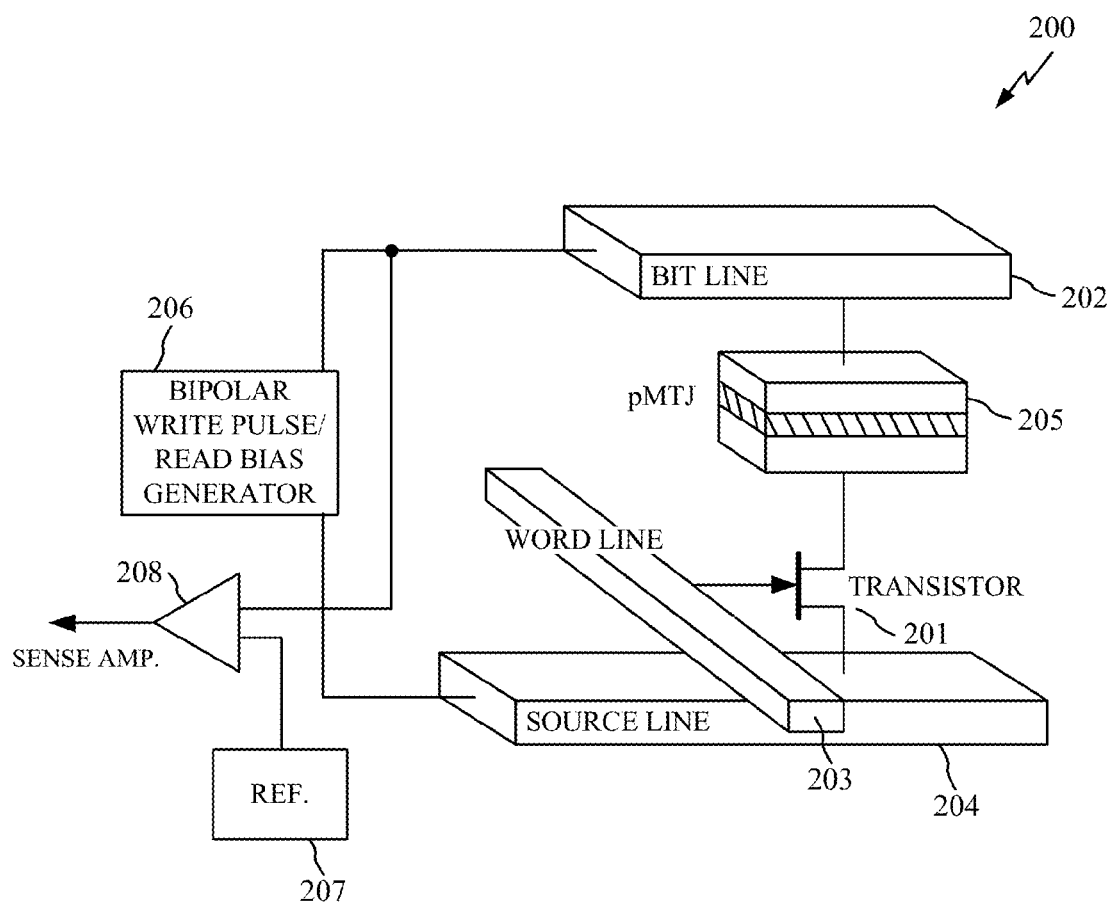
FIG. 2 is a conceptual diagram of a conventional spin transfer torque magnetic random access memory (STT-MRAM) cell including an MTJ.

FIG. 2 illustrates a conventional STT-MRAM bit cell 200. The STT-MRAM bit cell 200 includes a perpendicular magnetic tunnel junction (pMTJ) storage element 205, a transistor 201, a bit line 202 and a word line 203. The pMTJ storage element 205 is formed from a reference layer and a free layer, each of which can hold a magnetic field or polarization, separated by a thin non-magnetic insulating layer (tunneling barrier). Electrons from the reference layer and the free layer can penetrate through the tunneling barrier due to a tunneling effect under a bias voltage applied to the ferromagnetic layers. The magnetic polarization of the free layer can be reversed so that the polarity of the reference layer and the free layer are either substantially aligned or opposite. The resistance of the electrical path through the pMTJ storage element 205 varies depending on the alignment of the polarizations of the reference layer and free layer. The STT-MRAM bit cell 200 also includes a source line 204, a sense amplifier 208, read/write circuitry 206 and a bit line reference 207.

Figure 3:
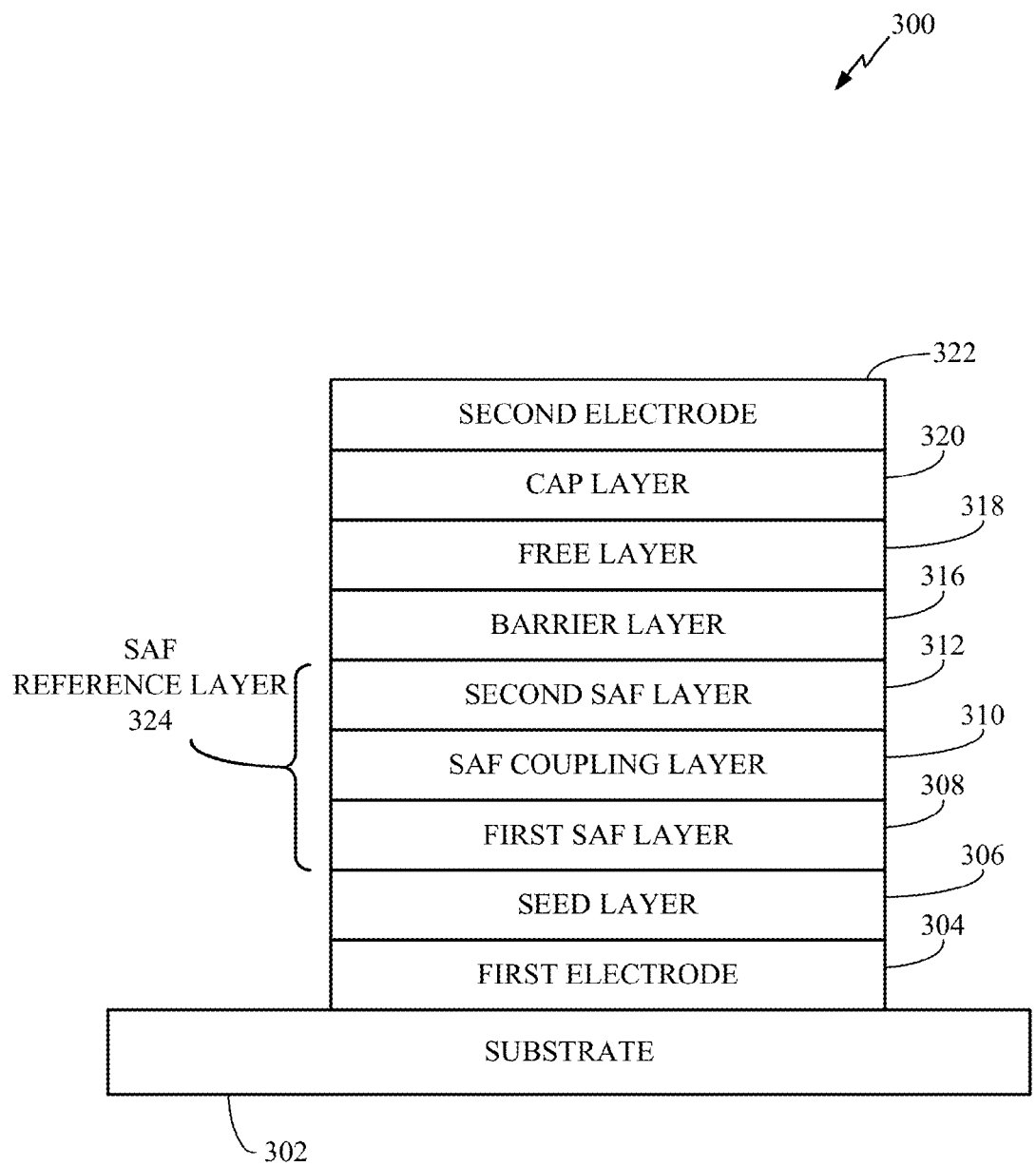
FIG. 3 is a cross sectional diagram illustrating a conventional perpendicular magnetic tunnel junction (pMTJ) structure.

Materials that form a perpendicular magnetic tunnel junction (pMTJ) of an STT-MRAM generally exhibit high tunneling magneto resistance (TMR), high perpendicular magnetic anisotropy (PMA) and good data retention. FIG. 3 illustrates a cross-sectional view of a conventional perpendicular magnetic tunnel junction (pMTJ) structure.

Representatively, an MTJ structure 300, which is shown as a pMTJ structure in FIG. 3, is formed on a substrate 302. The MTJ structure 300 may be formed on a semiconductor substrate, such as a silicon substrate, or any other alternative suitable substrate material. The MTJ structure 300 may include a first electrode 304, a seed layer 306, and a synthetic antiferromagnetic (SAF) reference layer 324. The SAF reference layer 324 includes a first synthetic antiferromagnetic (SAF) layer 308, a SAF coupling layer 310, and a second SAF layer 312. The first SAF layer 308 and the second SAF layer 312 by themselves are ferromagnetic layers, but when coupled together through the SAF coupling layer 310 form the synthetic antiferromagnetic (SAF) reference layer 324. The MTJ structure 300 also includes a barrier layer 316, a free layer 318, a cap layer 320 (also known as a capping layer), and a second electrode 322. The MTJ structure 300 may be a part of various types of devices, such as a semiconductor memory device (e.g., MRAM).

In this configuration, the first electrode 304 and the second electrode 322 include conductive materials (e.g., tantalum (Ta)). In other configurations, the first electrode 304 and/or second electrode 322 may include other appropriate materials, including but not limited to platinum (Pt), copper (Cu), gold (Au), aluminum (Al), or other like conductive materials. The first electrode 304 and the second electrode 322 may employ different materials within the MTJ structure 300.

A seed layer 306 is formed on the first electrode 304. The seed layer 306 may provide a mechanical and crystalline substrate for the first SAF layer 308. The seed layer 306 may be a compound material, including but not limited to, nickel chromium (NiCr), nickel iron (NiFe), NiFeCr, or other suitable materials for the seed layer 306. When the seed layer 306 is grown or otherwise coupled to the first electrode 304, a smooth and dense crystalline structure results in the seed layer 306. In this configuration, the seed layer 306 promotes growth of subsequently formed layers in the MTJ structure 300 according to a specific crystalline orientation. The crystalline structure of the seed layer 306 may be selected to be any crystal orientation within the Miller index notation system, but is often chosen to be in the (111) crystal orientation.

A first SAF layer 308 is formed on the seed layer 306. The first SAF layer 308 includes a multilayer stack of materials formed on the seed layer 306, which may be referred to herein as a first anti-parallel pinned layer (AP1). The multilayer stack of materials in the first SAF layer 308 may be a ferromagnetic material or a combination of materials to create a ferromagnetic moment in the first SAF layer 308. The multilayer stack of materials forming the first SAF layer 308 include, but are not limited to, cobalt (Co), cobalt in combination with other materials such as nickel (Ni), platinum (Pt), or palladium (Pd), or other like ferromagnetic materials.

An SAF coupling layer 310 is formed on the first SAF layer 308, and promotes magnetic coupling between the first SAF layer 308 and a second SAF layer 312. The second SAF layer 312 has a magnetic orientation anti-parallel with the first SAF layer 308. The SAF coupling layer 310 includes material that aides in this coupling including, but not limited to, ruthenium (Ru), tantalum (Ta), gadolinium (Gd), platinum (Pt), hafnium (Hf), osmium (Os), rhodium (Rh), niobium (Nb), terbium (Tb), or other like materials. The SAF coupling layer 310 may also include materials to provide mechanical and/or crystalline structural support for the first SAF layer 308 and the second SAF layer 312.

The second SAF layer 312 is formed on the SAF coupling layer 310. The second SAF layer 312 may have similar materials as the first SAF layer 308, but may include other materials. The combination of the first SAF layer 308, the SAF coupling layer 310, and the second SAF layer 312 forms a SAF reference layer 324, which is often referred to as a "pinned layer" in the MTJ structure 300. The SAF reference layer 324 fixes, or pins, the magnetization direction of the SAF reference layer 324 through anti-ferromagnetic coupling. As described herein, the second SAF layer 312 may be referred to as a second anti-parallel pinned layer (AP2). In this arrangement, the first anti-parallel pinned layer (AP1) is separated from the second anti-parallel pinned layer (AP2) by the SAF coupling layer 310 to form the SAF reference layer 324. The SAF reference layer 324 may include a cobalt-iron-boron (CoFeB) film. The SAF reference layer 324 may also include other ferromagnetic material layers, such as CoFeTa, NiFe, Co, CoFe, CoPt, CoPd, FePt, or any alloy of Ni, Co and Fe.

A TMR enhancement layer of the SAF reference layer 324 abutting the barrier layer 316 may be formed of a material, such as CoFeB, that provides a crystalline orientation for the barrier layer 316. As with the seed layer 306, the material in the SAF reference layer 324 provides a template for subsequent layers to be grown in a specific crystalline orientation. This orientation may be in any direction within the Miller index system, but is often in the (100) (or (001)) crystal orientation.

A barrier layer 316 (also referred to as a tunnel barrier layer) is formed on the SAF reference layer 324. The barrier layer 316 provides a tunnel barrier for electrons travelling between the SAF reference layer 324 and the free layer 318. The barrier layer 316, which may include magnesium oxide (MgO), is formed on the SAF reference layer 324 and may have a crystalline structure. The crystalline structure of the barrier layer 316 may be in the (100) direction. The barrier layer 316 may include other elements or other materials, such as aluminum oxide (AlO), aluminum nitride (AlN), aluminum oxynitride (AlON), or other non-magnetic or dielectric material. The thickness of the barrier layer 316 is formed such that electrons can tunnel from the SAF reference layer 324 through the barrier layer 316 to the free layer 318 when a biasing voltage is applied to the MTJ structure 300.

The free layer 318, which may be cobalt-iron-boron (CoFeB), is formed on the barrier layer 316. The free layer 318, when initially deposited on the barrier layer 316, is an amorphous structure. That is, the free layer 318 does not have a crystalline structure when initially deposited on the barrier layer 316. The free layer 318 is also a ferromagnetic layer or multilayer material, which may include similar ferromagnetic material as the SAF reference layer 324 or may include different materials.

In this configuration, the free layer 318 includes a ferromagnetic material that is not fixed or pinned in a specific magnetic orientation. The magnetization orientation of the free layer 318 is able to rotate to be in a parallel or an anti-parallel direction to the pinned magnetization of the SAF reference layer 324. A tunneling current flows perpendicularly through the barrier layer 316 depending upon the relative magnetization directions of the SAF reference layer 324 and the free layer 318.

A cap layer 320 is formed on the free layer 318. The cap layer 320 may be a dielectric layer, or other insulating layer, to allow containment of the magnetic and electric fields between the free layer 318 and the SAF reference layer 324. The cap layer 320 helps reduce the switching current density that switches the MTJ structure 300 from one orientation (e.g., parallel) to the other (e.g., anti-parallel). The cap layer 320, which may also be referred to as a capping layer, may be an oxide, such as, for example, amorphous aluminum oxide (AlOx) or amorphous hafnium oxide (HfOx). The cap layer 320 may also be other materials, such as magnesium oxide (MgO) or other dielectric materials without departing from the scope of the present disclosure.

The second electrode 322 is formed on the cap layer 320. In one configuration, the second electrode 322 includes tantalum. Alternatively, the second electrode 322 includes any other suitable conductive material for electrical connection of the MTJ structure 300 to other devices or portions of a circuit. Formation of the second electrode 322 on the cap layer 320 completes the MTJ structure 300.

In the MTJ structure 300, the SAF reference layer 324 may include numerous repeats of cobalt (Co) and platinum (Pt) layers to achieve a predetermined thermal stability and tunneling magneto resistance. The numerous repeats of Co and Pt layers, however, add significant thickness to the synthetic antiferromagnetic (SAF) reference layer 324. Reducing the thickness of the SAF reference by reducing the number of repeats of Co and Pt layers may fail to provide the desired thermal stability and tunneling magneto resistance.

Reducing the total thickness of a multi-layer material stack in a pMTJ structure, however, generally has the effect of reducing a surface roughness of the material stack. The reduced surface roughness improves the thermal stability and perpendicular magnetic anisotropy (PMA) of the pMTJ structure to compensate for any reduction of the desired thermal stability and tunneling magneto resistance from reducing the number of repeats of Co and Pt layers. Thus, a pMTJ structure constructed with a thinner material stack generally exhibits better thermal stability, better PMA and better TMR than a pMTJ structure constructed with a thicker martial stack.

Figure 4:
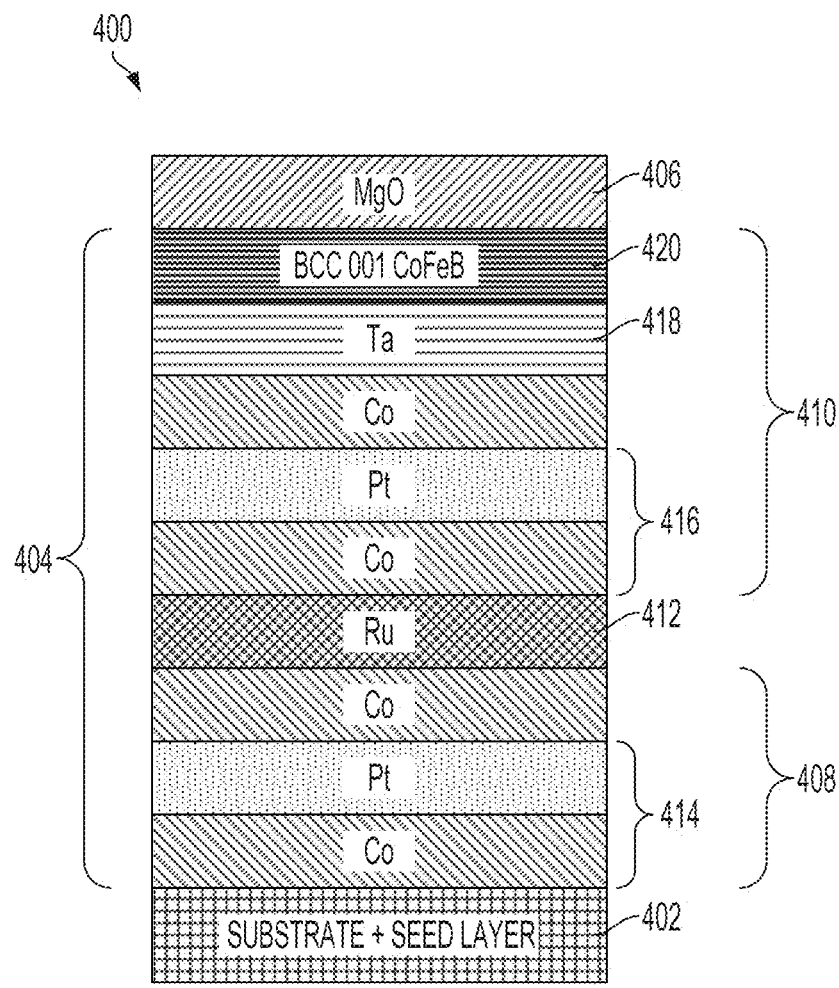
FIG. 4 is a cross sectional diagram illustrating a conventional perpendicular magnetic tunnel junction (pMTJ) structure illustrating a conventional synthetic anti-ferromagnetic (SAF) material stack.

FIG. 4 illustrates a cross-sectional view of a conventional perpendicular magnetic tunnel junction (pMTJ) structure 400 illustrating conventional material structures and layer thicknesses. The conventional pMTJ structure 400 includes a substrate and seed layer 402, an SAF reference layer 404 and a barrier layer 406. In this example, the barrier layer material is MgO. The SAF reference layer 404 includes a first SAF layer 408 and a second SAF layer 410 separated by an SAF coupling layer 412. The first SAF layer 408 and the second SAF layer 410 by themselves are ferromagnetic layers, but when coupled together through the SAF coupling layer 412 form the synthetic antiferromagnetic (SAF) reference layer 404. In this example, the SAF coupling layer material is Ru.

SAF coupling layer 412 (e.g., Ru) induces the antiferromagnetic alignment in the magnetic layers (first SAF layer 408 and second SAF layer 410) which are below and above the SAF coupling layer 412. A coupling enhancement layer 413 (e.g., Co) on top of SAF coupling layer 412 enhances the coupling effect of the SAF coupling layer 412.

The first SAF layer 408 is a multilayer including between 6 and 14 repeats of Co and Pt layers 414. The second SAF layer 410 is a multilayer including between 5 and 10 repeats of Co and Pt layers 416. The second SAF layer 410 also includes a tunneling magnetic resistance (TMR) enhancement buffer layer 418 and a TMR enhancement layer 420. In this example, the TMR enhancement layer 420 material may be CoFeB.

In the conventional pMTJ structure 400, the TMR enhancement buffer layer 418 provides a structural buffer against the TMR enhancement layer 420 to avoid disturbing the crystal orientation in the TMR enhancement layer 420. The TMR enhancement buffer layer 418 also acts as a diffusion barrier and magnetic coupling layer to enhance tunneling magnetic resistance. In this example, the TMR enhancement buffer layer 418 material is tantalum.

In the conventional pMTJ structure 400 the numerous repeats of Co and Pt layers 414, 416 add significant thickness to the SAF reference layer. In this example, the overall height of the SAF reference layer 404 is between 15 and 30 nanometers. Attempts to reduce thickness by reducing the number of repeats of Co and Pt layers 414, 416 has resulted in poor thermal stability and low TMR. It is believed that the poor thermal stability in the conventional pMTJ structure with reduced thickness may be at least partially caused by the use of a single layer of Ta as a TMR enhancement buffer layer 418. The TMR enhancement buffer layer 418 of Ta may not provide a sufficient barrier to prevent boron diffusion from the TMR enhancement layer 420 into the SAF coupling layer 412 and into the first SAF layer 408. Boron diffusion through the SAF coupling layer 412 may contribute to poor thermal stability and reduced TMR.

Aspects of the present disclosure include a pMTJ structure with reduced repeats of Co and Pt layers, while retaining a desired thermal stability and tunneling magneto resistance. Reducing the total thickness of a multi-layer material stack in a pMTJ structure generally has the effect of reducing a surface roughness of the material stack. The reduced surface roughness improves the thermal stability and perpendicular magnetic anisotropy (PMA) of the pMTJ structure. Thus, a pMTJ structure constructed with a thinner material stack generally exhibits better thermal stability, better PMA and better TMR than a pMTJ structure constructed with a thicker martial stack. This substantially decreases the overall thickness to create an ultrathin perpendicular SAF reference layer structure. The ultrathin perpendicular SAF reference layer also allows faster etching times, with reduced surface roughness and simpler fabrication.

Figure 5:
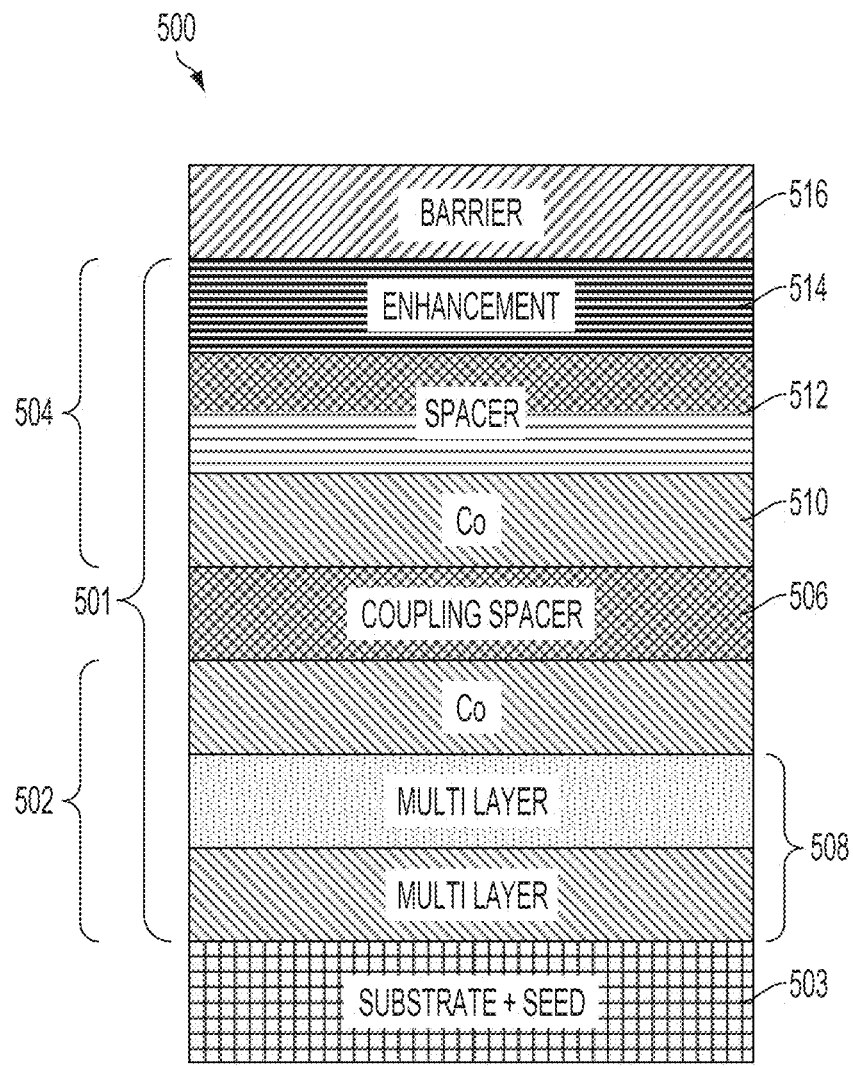
FIG. 5 is a cross sectional diagram illustrating a perpendicular MTJ structure in accordance with an aspect of the present disclosure.

FIG. 5 illustrates a cross sectional view of a pMTJ structure 500 in accordance with an aspect of the present disclosure. An SAF reference layer 501 is constructed on a substrate and seed layer 503 in the pMTJ structure 500. The SAF reference layer 501 includes a first SAF layer 502, a second SAF layer 504 and a SAF coupling layer 506 between the first SAF layer 502 and the second SAF layer 504. The first SAF layer 502 may be a multilayer stack of materials. In this example, the multilayer stack includes a PMA multilayer stack 508 of cobalt and platinum layers, which may be repeated from 2 to 10 times. In alternative structures according to aspects of the present disclosure, the PMA multilayer stack 508 may include multilayers of cobalt and palladium or cobalt and nickel instead of cobalt and platinum. The SAF coupling layer 506 may be ruthenium (Ru), Iridium (Ir) Osmium (Os), or rhodium (Rh), for example.

The first SAF layer 502 and the second SAF layer 504 by themselves are ferromagnetic layers, but when coupled together through the SAF coupling layer 506 form the synthetic antiferromagnetic (SAF) reference layer 501. In this example, the SAF coupling layer material is Ru.

SAF coupling layer 506 (e.g., Ru) induces the anti-ferromagnetic alignment in the magnetic layers (first SAF layer 502 and second SAF layer 504) which are below and above the SAF coupling layer 506. The second SAF layer 504 may include a thin coupling enhancement layer 510 (e.g., Co) on top of SAF coupling layer. The thin coupling enhancement layer 510 enhances the coupling effect of the thin coupling enhancement layer 510.

According to aspects of the present disclosure, an amorphous spacer layer 512 is deposited over the thin coupling enhancement layer 510. The amorphous spacer layer 512 provides annealing stability and tunneling magnetic resistance (TMR) enhancement. According to aspects of the present disclosure, the amorphous spacer layer 512 may include an alloy or multilayer of cobalt and tantalum or iron and tantalum that is deposited on the thin coupling enhancement layer 510 (e.g., cobalt). A TMR enhancement layer 514 of the SAF reference layer 501 may be cobalt-iron-boron in a body-centered cubic (001) orientation, which abuts a barrier layer 516 (e.g., MgO). To complete a perpendicular MTJ structure, a free layer structure (not shown) is deposited on the barrier layer 516. Optionally as part of the second SAF layer 504, another layer (not shown), such as tantalum, platinum, or a stack or mixed layer of platinum and tantalum, may be deposited between the thin coupling enhancement layer 510 and the amorphous spacer layer 512.

According to an aspect of the present disclosure, the amorphous spacer layer 512 is made of an alloy or multi-layer of cobalt and tantalum or iron and tantalum. The amorphous spacer layer 512 is substantially thicker than the TMR enhancement buffer layer 418 (FIG. 4) that has been used in conventional pMTJ structures and blocks boron diffusion more effectively. This helps to maintain or increase annealing stability and TMR provided by a material stack with reduced repetitions of Co/Pt layers.

The amorphous spacer layer 512 may also act as a diffusion barrier block to prevent or retard boron diffusion from the TMR enhancement layer 514 of the SAF reference layer 501 to the SAF coupling layer 506. The amorphous spacer layer 512 may also act as a structural barrier to promote the formation of the body-centered cubic (001) structure of CoFeB material in the TMR enhancement layer 514, and as a magnetic coupling layer and to enhance or maintain TMR during high temperature annealing.

According on an aspect of the present disclosure, the first SAF layer 502 may include a number of repetitions of cobalt and platinum of the PMA multilayer stack 508. In one example, according to an aspect of the present disclosure, the first SAF layer is constructed with only three repetitions of cobalt and platinum in the PMA multilayer stack 508. In this example, the overall thickness of the SAF reference layer 501 is reduced to about 6 nm.

According to aspects of the present disclosure, the second SAF layer 504 does not include any repetitions of the PMA multilayer stack 508 and may include a single PMA layer such as the thin coupling enhancement layer 510, for example. In an alternative example, the second SAF layer 504 may include one to five repetitions of cobalt and platinum of the PMA multilayer stack 508.

Figure 6:
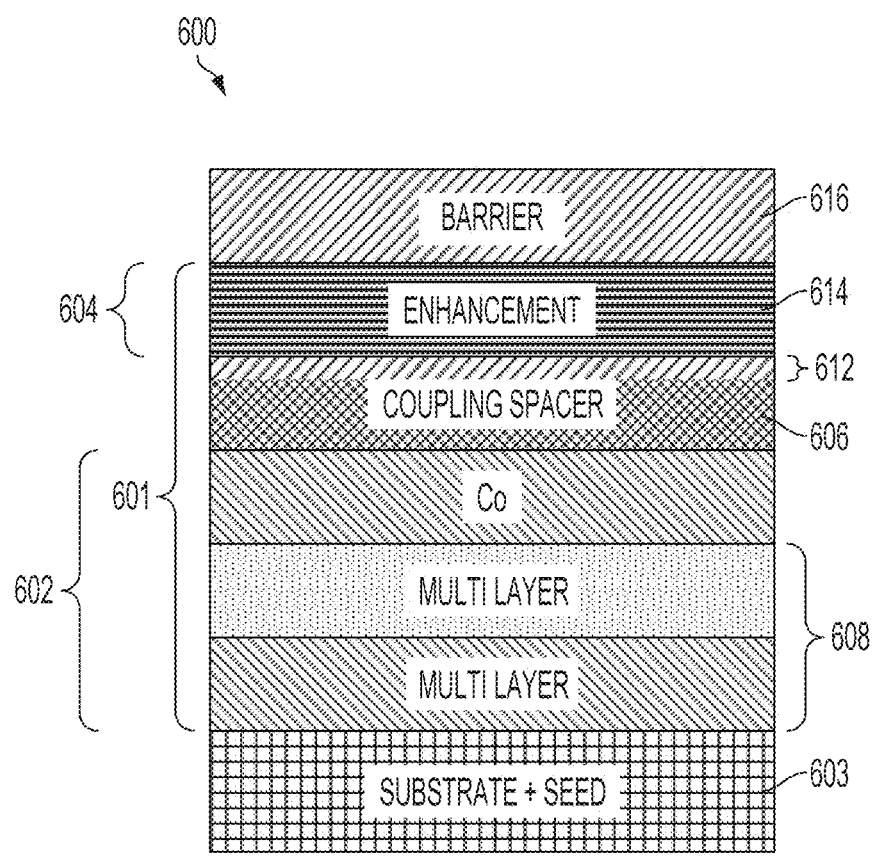
FIG. 6 is a cross sectional diagram illustrating a perpendicular MTJ structure in accordance with another aspect of the present disclosure.

FIG. 6 is a cross sectional view illustrating a pMTJ structure 600 in accordance with an aspect of the present disclosure. An SAF reference layer 601 is constructed on a substrate and seed layer 603 in the pMTJ structure 600. A barrier layer 616 is formed on the SAF reference layer 601. The SAF reference layer 601 includes a first SAF layer 602, a second SAF layer 604 and a SAF coupling spacer 606 between the first SAF layer 602 and the second SAF layer 604. The first SAF layer 602 may be a multilayer stack of materials. In this example, the multilayer stack includes a PMA multilayer stack 608 of cobalt and platinum layers, which may be repeated from 2 to 10 times. In alternative structures according to aspects of the present disclosure, the PMA multilayer stack 608 may include multilayers of cobalt and palladium or cobalt and nickel instead of cobalt and platinum. The SAF coupling spacer 606 may be ruthenium (Ru), Iridium (Ir) Osmium (Os), or rhodium (Rh), for example.

The second SAF layer 604 includes only a TMR enhancement layer 614 of, for example, CoFeB but does not include any repetitions of PMA multilayers. In this arrangement, an amorphous spacer layer 612 in the second SAF layer 604 is formed on the SAF coupling spacer 606, via surface treatment (e.g., light oxidation, plasma treatment or ion irradiation), to act as a basis for the TMR enhancement layer 614. The amorphous spacer layer 612 on the SAF coupling spacer 606 becomes, in essence, a portion of the second SAF layer 604. The surface treatment of the SAF coupling spacer 606 may be a light plasma treatment, which promotes the body-centered cubic (001) formation of the material (e.g., CoFeB) in the TMR enhancement layer 614.

According to this aspect of the present disclosure, the amorphous spacer layer 612 on the SAF coupling spacer 606 helps to maintain or increase annealing stability and TMR provided by a material stack with reduced repetitions of Co/Pt multilayers. The amorphous spacer layer 612 on the SAF coupling spacer 606 may also act as a structural barrier to promote the formation of the body-centered cubic (001) structure of material in the TMR enhancement layer 614.

According on an aspect of the present disclosure, the first SAF layer 602 may include a number of repetitions of cobalt and platinum of the PMA multilayer stack 608 to provide a first anti-parallel pinned layer (AP1). In one example, according to an aspect of the present disclosure, the first SAF layer AP1 is constructed with only three repetitions of cobalt and platinum in the PMA multilayer stack 608. In this example, the overall thickness of the SAF reference layer 601 is reduced to about 5 nm.

Aspects of the present disclosure substantially reduce the thickness of the second SAF layer 504, 604 or second anti-parallel pinned layer (AP2). Within an aspect of the present disclosure, the thickness of the first SAF layer AP1 may also be substantially reduced in thickness because the numbers of layers or repetition of layers in the first SAF layer AP1 may be reduced when using the amorphous spacer layer 612 on the SAF coupling spacer 606. Further, the overall thickness of the SAF reference layer (e.g., 501, 601) may be reduced from a 15 to 30 nanometer range to a 5 to 6 nanometer range when employing the structures of the present disclosure. Although specific materials and thicknesses are mentioned above, other materials and other layer thickness are also contemplated to be within the scope of the present disclosure.

Figure 7:
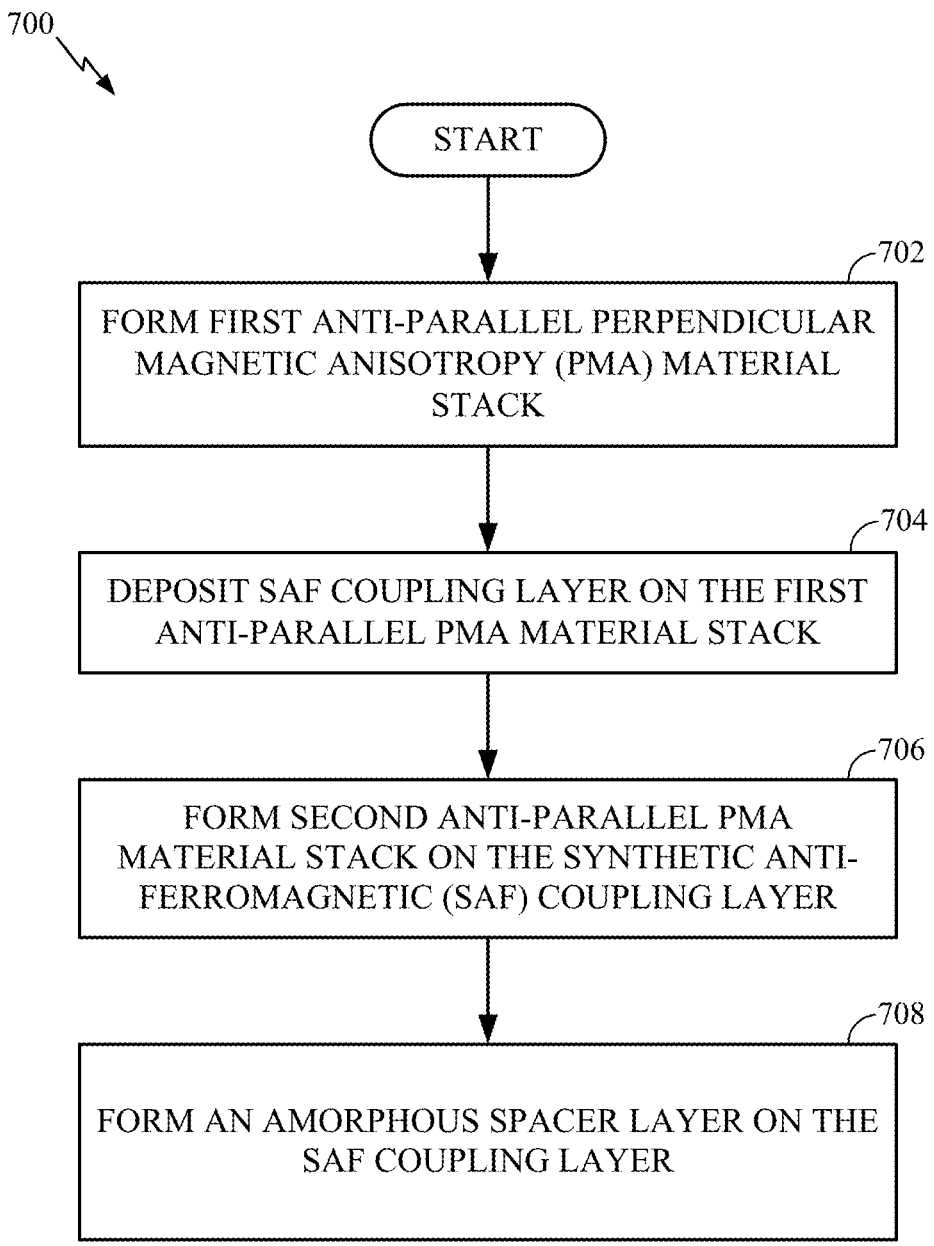
FIG. 7 is a process flow diagram illustrating a process of fabricating a perpendicular MTJ structure according to an aspect of the present disclosure.

A method of reducing synthetic anti-ferromagnetic (SAF) reference layer thickness in a perpendicular magnetic tunnel junction (MTJ) is described with reference to FIG. 7. The method 700 includes forming a first anti-parallel perpendicular magnetic anisotropy (PMA) material stack at block 702. For example, as shown in FIG. 5 and FIG. 6, a first SAF layer 502, 602 provides a first anti-parallel pinned layer (AP1). The first anti-parallel PMA material stack of AP1 may include a number of repetitions of PMA multilayers. The PMA multilayers may include cobalt and platinum, cobalt and palladium or cobalt and nickel, for example.

The method further includes depositing an SAF coupling layer on the first anti-parallel material stack at block 704 and forming a second anti-parallel PMA material stack on the SAF coupling layer at block 706. For example, as shown in FIG. 5 and FIG. 6, the second SAF layer 504 604 provides a second anti-parallel pinned layer (AP2) that is separated from AP1 by the SAF coupling spacer 506 606 of the SAF reference layer 501, 601.

According to aspects of the present disclosure, the second anti-parallel PMA material stack AP2 has no repetitions of PMA multilayers. At block 708, the method further includes forming an amorphous spacer layer on the SAF coupling layer. For example, in FIG. 6, the amorphous spacer layer 612 is formed on the SAF coupling spacer 606, via surface treatment, to act as a basis for the TMR enhancement layer 614. The amorphous spacer layer 612 on the SAF coupling spacer 606 becomes, in essence, a portion of the second SAF layer AP2. That is, the amorphous spacer layer 612 is formed within AP2 to maintain or increase TMR provided by the SAF reference layer 601 during high temperature annealing. The amorphous spacer layer includes an alloy or multilayer comprising tantalum and cobalt or tantalum and iron.

A perpendicular magnetic tunnel junction (MTJ) may include a perpendicular free layer, a perpendicular synthetic anti-ferromagnetic (SAF) reference layer; and a tunnel barrier layer between the SAF reference layer and the perpendicular free layer. The SAF reference layer may include a first anti-parallel material stack, a second anti-parallel material stack between the first anti-parallel material stack and the tunnel barrier layer, and an SAF coupling layer between the first anti-parallel material stack and the second anti-parallel material stack. The second anti-parallel material stack may include a means for blocking diffusion of boron from the second material stack to the first material stack to improve thermal stability of the SAF reference layer during an annealing process.

The means for blocking diffusion of boron may include the amorphous spacer layer 512 in the second SAF layer 504 as described above with reference to FIG. 5. For example, the amorphous spacer layer may be made from an alloy or multilayer comprising tantalum and cobalt or tantalum and iron or cobalt and iron and tantalum. Alternatively, the means for blocking boron diffusion improves thermal stability of the SAF reference layer during an annealing process may include a treated surface of the SAF coupling spacer 606, for example, as described in FIG. 6.

One aspect of the present disclosure includes a material stack of a synthetic anti-ferromagnetic (SAF) reference layer of a perpendicular magnetic tunnel junction (MTJ). According to this aspect of the disclosure, the material stack includes means for coupling a first SAF layer and second SAF layer of the SAF reference layer; and means for blocking diffusion of boron from the second SAF layer to the first SAF layer. The means for coupling the first SAF layer and second SAF layer of the SAF reference layer may include the SAF coupling layer 506 as described above with reference to FIG. 5, or the SAF coupling spacer 606 as described above with reference to FIG. 6, for example. The means for blocking diffusion of boron may include the amorphous spacer layer 512 in the second SAF layer 504 as described above with reference to FIG. 5, for example, in which the amorphous spacer layer may be made from an alloy or multilayer comprising tantalum and cobalt or tantalum and iron or cobalt and iron and tantalum. Alternatively, the means for blocking boron diffusion improves thermal stability of the material stack during an annealing process may include the treated surface of the SAF coupling spacer 606 as described above with reference to FIG. 6, for example.

In one aspect of the present disclosure, a synthetic anti-ferromagnetic (SAF) reference layer for a perpendicular magnetic tunnel junction (pMTJ) is formed with a reduced thickness by replacing perpendicular magnetic anisotropy (PMA) multilayers in a first SAF layer of the SAF reference layer with a single thin PMA layer. The reduced thickness of the SAF reference is achieved by reducing repetitions of PMA multilayers in a second SAF layer of the SAF reference layer. Tunneling magnetic resistance is maintained or increased during high temperature annealing by including an amorphous TMR enhancement spacer layer in the top SAF layer. The amorphous spacer layer may be an alloy or multilayer comprising tantalum and cobalt or tantalum and iron or cobalt and iron and tantalum. Alternatively, the amorphous spacer layer may be formed by treating a portion of an SAF coupling layer between the first SAF layer and the second SAF layer.

Figure 8:
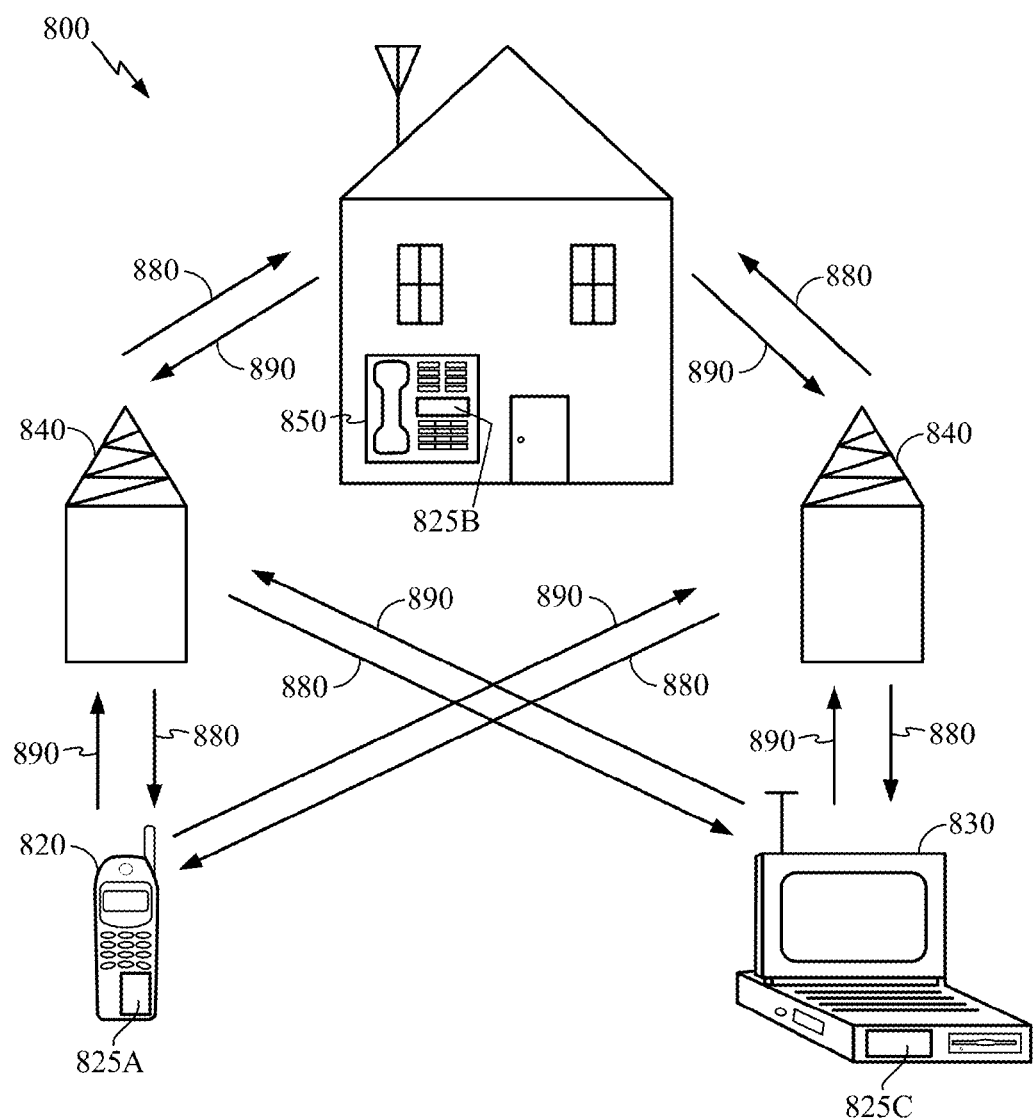
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed devices. It will be recognized that other devices may also include the disclosed devices, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication system (PCS) unit, a portable data unit such as a personal data assistants, a GPS enabled device, a navigation device, a set top box, a music player, a video player, an entertainment unit, a fixed location data unit such as a meter reading equipment, or other device that store or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed devices.

Figure 9:
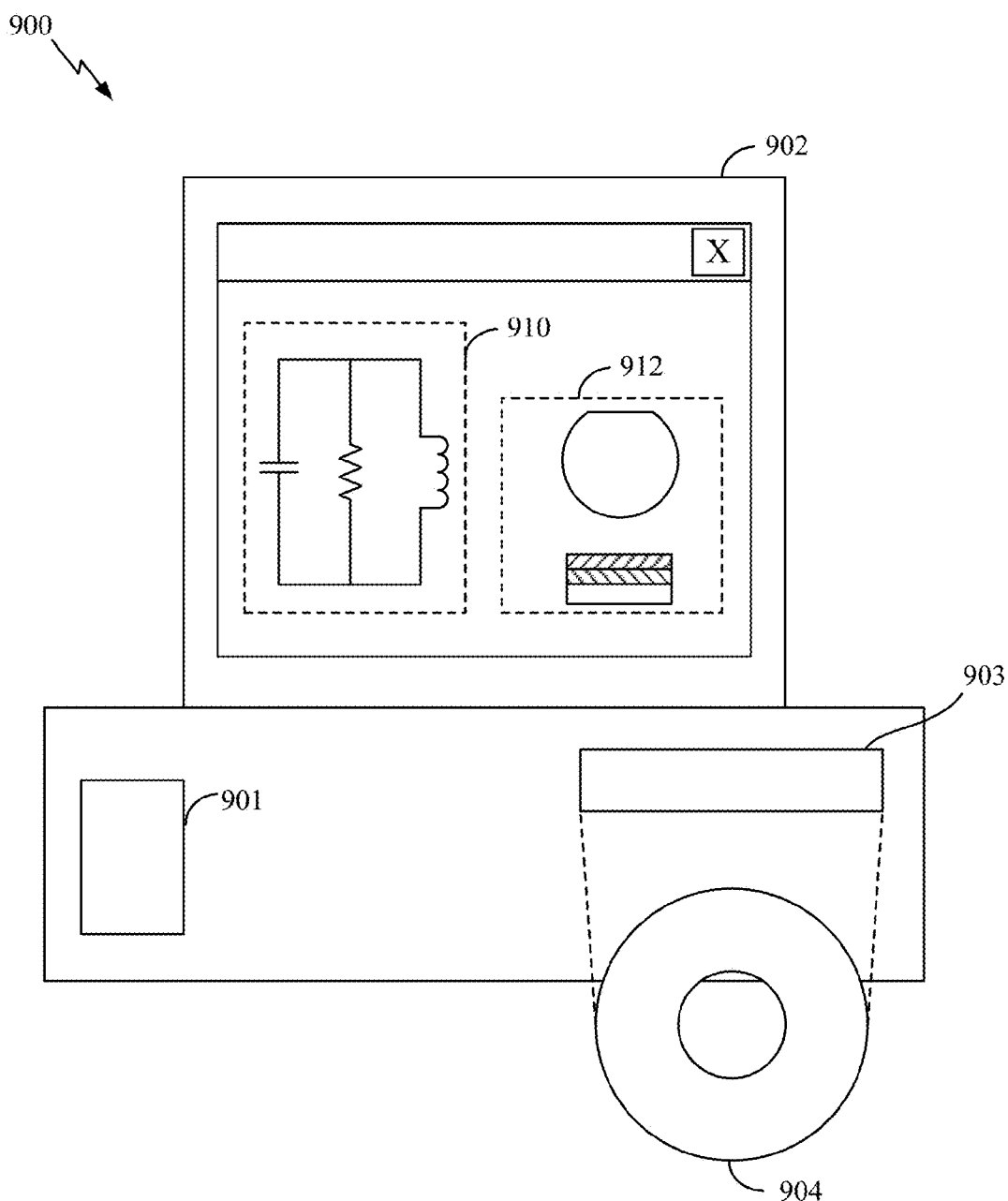
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the perpendicular magnetic tunnel junction structures disclosed above. A design workstation 900 includes a hard disk 901 containing operating system software, support files, and design software such as Cadence or OrCAD. The design workstation 900 also includes a display 902 to facilitate design of a circuit 910 or a semiconductor component 912 such as a perpendicular magnetic tunnel junction structure in accordance with an aspect of the present disclosure. A storage medium 904 is provided for tangibly storing the design of the circuit 910 or the semiconductor component 912. The design of the circuit 910 or the semiconductor component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the semiconductor component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core), or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A material stack of a synthetic anti-ferromagnetic (SAF) reference layer of a perpendicular magnetic tunnel junction (MTJ), the material stack comprising:
    an SAF coupling layer;
    a coupling enhancement layer comprising a single layer directly on the SAF coupling layer;
    an amorphous spacer layer directly on the coupling enhancement layer, in which the amorphous spacer layer comprises an alloy or multilayer comprising tantalum and cobalt or tantalum and iron or cobalt and iron and tantalum; and
    no repetitions of a perpendicular magnetic anisotropy (PMA) multilayer within an anti-parallel pinned layer directly on the SAF coupling layer.

2. The material stack of claim 1, in which the amorphous spacer layer is configured to maintain or increase tunneling magneto resistance (TMR) provided by the material stack having a reduced thickness during an annealing process.

3. The material stack of claim 1, in which the coupling enhancement layer comprises a single PMA layer between the SAF coupling layer and the amorphous spacer layer.

4. A material stack of a synthetic anti-ferromagnetic (SAF) reference layer of a perpendicular magnetic tunnel junction (MTJ), the material stack comprising:
    an SAF coupling layer;
    an amorphous spacer layer on the SAF coupling layer, the amorphous spacer layer comprising an alloy or multilayer comprising tantalum and cobalt or tantalum and iron or cobalt and iron and tantalum;
    a plurality of repetitions of perpendicular magnetic anisotropy (PMA) multilayers within a first anti-parallel pinned layer (AP1) directly coupled to the SAF coupling layer; and
    no repetitions of the PMA multilayers within a second anti-parallel pinned layer (AP2) on the SAF coupling layer.

5. The material stack of claim 1, integrated into a mobile phone, a set top box, a music player, a video player, an entertainment unit, a navigation device, a computer, a hand-held personal communication system (PCS) unit, a portable data unit, and/or a fixed location data unit.

* * * * *